United States Patent
Tyler et al.

(10) Patent No.: US 10,826,426 B1
(45) Date of Patent: Nov. 3, 2020

(54) EARTH MOUNT UTILITY SCALE PHOTOVOLTAIC ARRAY WITH EDGE PORTIONS RESTING ON GROUND SUPPORT AREA

(71) Applicant: Erthos Inc., Queen Creek, AZ (US)

(72) Inventors: James Scott Tyler, Queen Creek, AZ (US); Willie Hammack, Queen Creek, AZ (US); Michael Gladkin, Queen Creek, AZ (US)

(73) Assignee: ERTHOS INC., Queen Creek, AZ (US)

( * ) Notice: Subject to any disclaimer, the term of this patent is extended or adjusted under 35 U.S.C. 154(b) by 0 days.

(21) Appl. No.: 16/682,503

(22) Filed: Nov. 13, 2019

Related U.S. Application Data

(60) Provisional application No. 62/903,369, filed on Sep. 20, 2019.

(51) Int. Cl.
*H02N 6/00* (2006.01)
*H02S 20/10* (2014.01)
*H02S 30/10* (2014.01)
*H02S 40/36* (2014.01)

(52) U.S. Cl.
CPC .............. *H02S 20/10* (2014.12); *H02S 30/10* (2014.12); *H02S 40/36* (2014.12)

(58) Field of Classification Search
CPC ........ H02S 40/42; H02S 40/425; H02S 20/10; H02S 30/10
See application file for complete search history.

(56) References Cited

U.S. PATENT DOCUMENTS

| | | | | |
|---|---|---|---|---|
| 2008/0135094 A1* | 6/2008 | Corrales | ............... | H01L 31/024 136/259 |
| 2011/0197524 A1* | 8/2011 | Sahlin | ................. | H01L 31/0481 52/173.3 |
| 2013/0056595 A1* | 3/2013 | Tomlinson | .............. | H02S 20/22 248/176.1 |
| 2014/0083028 A1* | 3/2014 | Richardson | ............. | F24S 40/10 52/173.3 |
| 2015/0090314 A1* | 4/2015 | Yang | ................... | H01L 31/0747 136/244 |
| 2018/0274806 A1* | 9/2018 | Arndt | ..................... | H02S 40/425 |
| 2018/0366600 A1* | 12/2018 | Ayers | ..................... | B09B 1/004 |

OTHER PUBLICATIONS

Mustache ("Topic: I built a solar powered off grid office from a Tuff-Shed," mrmoneymustache.com, publicly available as early as May 29, 2016), https://web.archive.org/web/20160529091143/https://forum.mrmoneymustache.com/do-it-yourself-forum!/i-built-a-solar-powered-off-grid-office-from-a-tuff-shed/ (Year: 2016).*

* cited by examiner

*Primary Examiner* — Angelo Trivisonno
(74) *Attorney, Agent, or Firm* — Nath, Goldberg & Meyer; Stanley N. Protigal; Jerald L. Meyer

(57) ABSTRACT

An earth mount enabled utility scale solar photovoltaic array has plural rows of solar panels supported on the ground so as to establish an earth orientation of the solar panels. Edge portions of the panels rest on a ground support area and provide mechanical support, and an end curb member abuts at least one edge of the arrangement. The panels are interconnected in at least one series-connected string extending in at least two rows so that the string has a distance between terminal ends of the series connection less than a lengthwise dimension of the solar panels constituting the string, routed to reduce "home run" connections at the end of the string.

23 Claims, 15 Drawing Sheets

EARTH MOUNT UTILITY SCALE PHOTOVOLTAIC ARRAY WITH EDGE PORTIONS RESTING ON GROUND SUPPORT AREA

RELATED APPLICATION(S)

The present Patent Application claims priority to Provisional Patent Application No. 62/903,369, filed Sep. 20, 2019, which is assigned to the assignee hereof and filed by the inventors hereof and which is incorporated by reference herein.

BACKGROUND

Technical Field

The disclosed technology relates to mounting of solar panels using a terrestrial or ground-based mounting system.

Background Art

Solar panels, also called solar modules, are assemblies of multiple photovoltaic (PV) cells hardwired together to form a single unit, typically as a rigid piece, although it is also possible to provide flexible solar panels. Groups of solar panels are aggregated into an array. The panels are also wired together to form a string, which are in turn connected to a power receiving unit, typically an inverter or other controller which provides an initial power output. One or more solar arrays form a solar plant.

A silicon based photovoltaic (PV) module, also commonly referred to as crystalline silicon (C Si), is a packaged, connected assembly of typically 6×12 photovoltaic solar cells. For utility scale installations, the solar panels comprise a plurality of solar cells hardwired into a single unit, which is the module or panel. In a typical application, the panel is made up of component solar cells. In the above example of 6×12, this would be 72 solar cells, although this can vary significantly according to design choice. The individual solar cells may be fabricated in any convenient manner, and if desired can be separately fabricated and mounted onto a panel substrate or can be directly fabricated onto the substrate. There are other types of PV module technology in use today such as "thin film" and variations of silicon-based technology. Of the thin film, at least two module technologies stand out. The first is CdTe (Cadmium Tellurium), also known as CadTel. The second is known as CIGS or CIS (Copper, Indium, Gallium, Selenium or simply Copper, Indium, Selenium).

Several panels are connected together to form an array in a procedure called "stringing". The number of panels making up a string can vary, but in a typical application, this can be 17-29 panels depending on both the environmental condition as well as the rated voltage of the module selected (string voltage). The size of an array is limited by power transmission limitations, including limiting maximum voltage and current at the array. The panels within an array are connected in one or more series and one or more parallel strings. A series string is a set of panels which are series connected to one another. This increases the power output of the string without a corresponding increase in current, but results in an increase in voltage. Since it is necessary to limit the maximum voltage output of the string as well as the maximum current output of the array, the array is often divided into multiple strings of a common voltage while summing the currents.

The number of panels in a string is given by way of non-limiting example, as this is a function of design considerations relating to panel voltage and related circuit parameters of the strings and arrays.

The arrays are in turn connected to power conversion and power transmission circuitry. This is accomplished by the internal connection of the solar cells within a panel, followed by connections between panels in an array, followed by connections to an inverter either directly or through wiring harnesses. The inverter is the first circuit providing the output of the solar plant. The inverter is connected to further output circuitry, which is connected to transmission circuitry. The details can vary, for example for systems with local power connections, but in most solar power systems, the first connection for power conversion, distribution and transmission is the inverter. In other words, the strings are connected either directly or through wiring harness connections to the inverter.

The disclosed techniques seek to reduce the levelized cost of energy (LCOE) created by modern utility scale solar PV power plants. The utility scale solar PV power plant is unique from the many other forms of solar power electricity production. Due to the nature of the size, energy cost, safety, regulations, and operating requirements of utility scale power production, the components, hardware, design, construction means and methods, operations and maintenance all have both specific and unique features which afford them the designation "utility scale".

Since the inception of PV technology, the technology has been an inherently expensive solution for power production. The PV cells contained within the heart of the solar modules have been both expensive to manufacture and relatively inefficient. Over the past 40 years, significant strides have been made on all fronts of PV cell and module manufacturing and technology, which have brought their price down to a point which has made the cost of solar based energy generation equal to and even less than all other forms of power generation in certain geographical areas.

When the technology was in its infancy, significant development was directed to handling and positioning the PV cells and their larger assemblies called modules. This development focused on what is now commonly referred to as "dual axis tracking". This concept seeks to keep the PV cells at a position which is perpendicular to the impingement of the sun's rays at all times through the day and the year. This method sought to extract the maximum energy from the cells in order to offset the very expensive cost.

As the price and efficiency of the cells and then modules improved, the costs of dual axis trackers became prohibitive relative to the cost of the panels. This resulted in the development two supplemental technologies now known as "fixed tilt" racking and "single axis tracking". Further developments included adaptation for these newer systems to roof-top mounting on home, office, commercial and industrial buildings. Fixed tilt and single-axis tracking methods are often categorized as "ground mount" technologies which separate them from the "roof mount" technologies. The ground mount reference is simply that they are not associated with a building rather they are supported by free-standing structures with their own foundations.

Safety and regulatory requirements are generally applied to both secluded solar PV power plants and roof-top systems, but are different for utility scale solar photovoltaic power plants than for solar photovoltaic installations which are not in a protected area, as will be described. A utility scale PV power plant typically operates at 1500 volts DC for the module. These modules are not allowed in applications other than utility scale due to the regulatory requirements on the voltage (EMF). Specifically, exceeding 600 volts on the DC side places the system in a category which requires alternative safety, and operating requirements on the system. Examples include requiring a secured fence surrounding the power plant which doesn't allow the public with unfettered access to the higher voltages as well as specific training requirements and certifications for individuals who will be accessing the utility scale solar plant.

The operation of utility scale solar voltaic power plants is distinguished by typical operation at EMF exceeding 600 volts. This is established by a number of different code requirements, including the (US) National Electrical Code (NEC), the International Electrotechnical Commission[3] (IEC, or Commission électrotechnique internationale), and its affiliates. Electrical connections between enclosures exceeding 600 volts are required to be secured in an enclosure such as a room or fenced area which is restricted to trained or qualified personnel. For the purposes of this disclosure, such an enclosure will be described as a "protected area". A non-limiting example of such a "protected area" is referenced in NEC Article 110, Part C, which provides the general requirements for over 600 volt applications. There can be variations in the voltage, as it is possible to design arrays that can safely operate at higher voltages in unprotected environments.

These distinctions just two examples of what separate utility scale solar PV power plants from other approaches such as "solar roads", or "personal use solar power devices".

As for the continued push to reduce the price of energy from the power plant, for reference, a utility scale solar plant can make electricity in the Southwestern US at $0.040/kWh as of the beginning 2019. With the same technology in the PV Cell's other than the voltage, a rooftop mounted system will average out to roughly $0.12/kWhr. This is a 3× difference in energy cost using what is essentially the same PV Cell technology. The reasons for this drastic reduction in price go far beyond the cell and the module, and in many cases are only allowed to happen inside the utility scale plant.

Solar panels, when deployed, for example in large solar farms, are typically mounted on racks with the racks orienting the panels toward the sun. In the case of gimballed racks, called trackers, the panel is pivoted so as to face the sun throughout the day, with some systems also accounting for solar elevation or otherwise account for the effect of the sun's analemma. The advantages of fixed racking solar panels and of tracking are of course to increase efficiency, both in establishing an alignment normal to the sunlight and to more efficiently utilize the physical area of the solar cells.

A fixed tilt rack system typically is positioned at 25° from horizontal, with the angle dependent on various factors including the latitude of the installation site. If a panel is mounted 25° normal to the sunlight, it will convert approximately the same percentage of impinging light, but the amount of impinging light will be the cosine of the angle from normal. Taking the example of 25°, the impinging light is approximately 90% that of a normal alignment, with some additional loss from the fact that the alignment of the solar cells is at an angle to solar light impingement. A tracker will generate 8%-11% more energy than can be expected from fixed rack mounted panels depending upon geography and array configuration. If the cost of solar panels is relatively high, this loss from misalignment is significant, but as costs of solar panels decreases, the costs resulting from inefficient alignment decreases to an extent that it may be more cost effective to increase the area of the panel and forego the expense of racking or tracking.

Off the ground, there is no need to sustain ground-caused damage. More generally, the nature of solar cells is such that they are generally waterproof and fairly durable. As an example, it is common for solar modules to be tested and certified to withstand hail of up to 25 mm (one inch) falling at 23 m/sec. While it is possible to clean solar panels, as a practical matter, racked solar panels are not cleaned because the expense is not justified by expected energy loss resulting from dirt and dust accumulation. As an example, in Southern California, estimated energy loss from dirt and dust is 6%/year, but if the panels were cleaned, the loss would approximate 1%/year.

One consideration in mounting solar panels on racks or trackers is the albedo effect, resulting from sunlight reflecting from the ground, resulting in back side heating. This issue is addressed in various ways, the most common of which is coating the back side of the solar panels with a white coating. A common coating for this purpose is a white pigmented Tedlar® PVF, sold by E.I. duPont de Neumours, of Wilmington, Del. The Tedlar® offers protection, but when pigmented white, reflects most of the back side light. A disadvantage is that, as a white coating, the white pigmented Tedlar® tends to retard heat discharge through the back side.

The voltage output of solar arrays is constrained. Conceptually, a solar array, or for that matter a portion of an entire solar plant, could be series-wired to provide electrical power transmission voltage. In addition for a need to segment a solar plant for redundancy, maintenance and to avoid arcing to the ground, solar panels are voltage limited by their construction due to the potential of arcing through the glass and backing. In typical configurations, the array output voltage (series voltage of the panels in a given string) is 1500 volts, with lower voltages such as 600 volts for residential applications and other applications where non-trained personnel are likely to be present. Therefore, conventionally, solar arrays are limited in voltage. In order to limit the voltage, panels are arranged in groups called strings, which are in turn connected to the inverter through harnesses. It has been necessary to provide harnessing arrangements due to the physical arrangement of the strings on the trackers or racks. In a typical tracker system, three sets of strings are used on a single tracker assembly. To connect those strings to the inverter, harnesses of varying configurations are used, although this number can change according to the length of the rack and other considerations.

The harnesses themselves are a significant cost factor. Since the system is voltage-limited, the total power output of the plant translates to substantial wiring costs for harness systems. Similarly, power losses through the wiring harness translates to additional costs. Therefore, it is desired to provide a configuration which reduces the length of cable runs in connection harnesses.

One wiring harness configuration used with racked modules is called "skip stringing" or "leapfrog wiring". In skip stringing, wiring harnesses bypass alternate panels in order to provide efficient wiring by limiting cabling to approximately the distance between alternating modules. The ability to achieve connections extending over a longer distance without a proportional increase in cabling allows positive and negative connections to be placed closer to the inverter, reducing the amount of harness conductors needed to connect to the inverter. Since the panels are alternately connected, the alternate panels within the same physical row are able to provide a return circuit, thereby reducing the distance between an end panel and the inverter. Ideally, one positive or negative pole connection for connecting the string to the inverter is only one panel away from the other pole connection to the inverter. This reduces the length of the "home run" wire, but requires that each link skip alternate panels in order to return along the same row.

While it would be possible to string panels across two or more rows, doing so would result in shortening of the rows, which increases costs. Skip stringing wiring is used because, by skipping adjacent panels, the length of a given string is maintained while providing for a return connection along the same row. This effectively doubles the length of a string over the length that would exist if the string were extended across two rows.

This system of stringing accommodates the polarities of the panels; however, this technique still requires wiring harnesses in the connection. In addition, these techniques still require additional harnesses to connect between the respective ends of the strings and the inverter. Since adjacent rows of panels are separated by a space corresponding to the cast shadow of racked panels, it becomes impractical to string panels across rows.

Another issue involving racked or tracker-mounted solar panels is the effect of wind. High wind forces, which in certain geographies reach hurricane force strength, often preclude the construction of solar power plants in those regions, or significantly increase the expense of doing so. In addition, the modules themselves are easily damaged by high winds requiring significant repair and replacement expenditures. In addition to obvious damage resulting from the direct forces of wind, the negative effects of cyclic loading can result in "micro-cracking". This "micro-cracking" damage occurs over time causing accelerated degradation rates of the module cells. This micro-cracking has become a serious issue for the industry influencing long-term module warranties.

Another issue involving racked or tracker-mounted solar panels is the effect of environmental corrosion due to corrosive soils and corrosive air such as salt spray. For example, typical power plants use driven steel piles which are sized as small as possible to counter the effects of wind loading on the overall structure. The design of the piles must take into consideration the corrosion of the steel or other materials, and still be able to last for 25 years. The more corrosive the soil, the thicker the posts will be designed and used as sacrificial steel to ensure the 25 year life. Similar issues exist for geographies near the oceans where salt spray environments exist.

SUMMARY

An earth mount enabled utility scale solar photovoltaic array is comprised of a plurality of solar panels supported on the ground so as to establish an earth orientation of the solar panels and positioned in a closely-adjacent arrangement or an abutting arrangement of plural rows of the solar panels. The solar panels are supported on the ground at edge portions thereof, so that the solar panels rest over or on a smoothed or substantially flat portion of the ground. Edge portions of the solar panel rest on a ground support area capable of supporting the edge portions by receiving edge frames of a plurality of panels, and the edge portions resting on the ground support area provide mechanical support for the panel. An end curb member abuts at least one edge of the arrangement of plural rows.

The solar panels are interconnected in at least one series-connected string, with the string extending along adjacent or closely adjacent solar panels along at least two rows so that the string has a distance between terminal ends of the series connection less than a lengthwise dimension of the solar panels constituting the string. The interconnection comprises wiring connections engaging terminal connections on the plurality of photovoltaic panels in the series-connected string, the wiring connections arranged to connect adjacent panels in an arrangement utilizing at least two rows of panels in the series-connected string connection, in which the string uses said at least two rows to route the connections, The wiring connections are arranged so that a string starting with a first end termination extends along a direction of said at least two rows and returns along an opposite direction of said at least two rows, which reduces or eliminates "home run" connections at the end of the string.

The earth orientation reduces the cost of the photovoltaic array by eliminating costs associated with providing and installing elevated supports for the solar panels. The earth orientation also provides a flat orientation that permits cleaning with automated horizontal surface cleaning equipment.

BRIEF DESCRIPTION OF THE DRAWINGS

FIG. 3A shows a hold-down clamp. FIG. 3B shows the clamp engaging the corner brackets. FIG. 3C shows the clamp anchored and FIG. 3D is a top view.

FIG. 5A shows a configuration for a clamp. FIG. 5B shows a configuration in which a bracket extends in a straight line connecting two modules.

FIG. 6A shows a furrow placement. FIG. 6B shows an end stop or curb member positioned at the edge of an array.

FIG. 7A is a perspective view of the corner bracket supporting four panels, with the panels in cut-away view. FIG. 7B shows the arrangement of the corner bracket.

FIG. 7C shows a bottom support. FIG. 7D shows a cross-section of the corner bracket with a cinch pin. FIG. 7E shows the corner bracket and cinch pin gripping an anchor cable. FIG. 7F shows the corner bracket with the cinch pin securing panels.

FIG. 8A shows the spring clip in profile. FIG. 8B shows the spring clip in an elevation view.

FIG. 8C shows the spring clip engaging one solar panel.

FIG. 9A shows two adjacent panels held by a spring clip. FIG. 9B shows the gripping arrangement of the spring clip.

The horizontal axis represents time. The vertical axis on the left represents the available sunlight, or "solar insolation". The vertical axis on the right indicates the power output of the power plant.

Figure 12A:
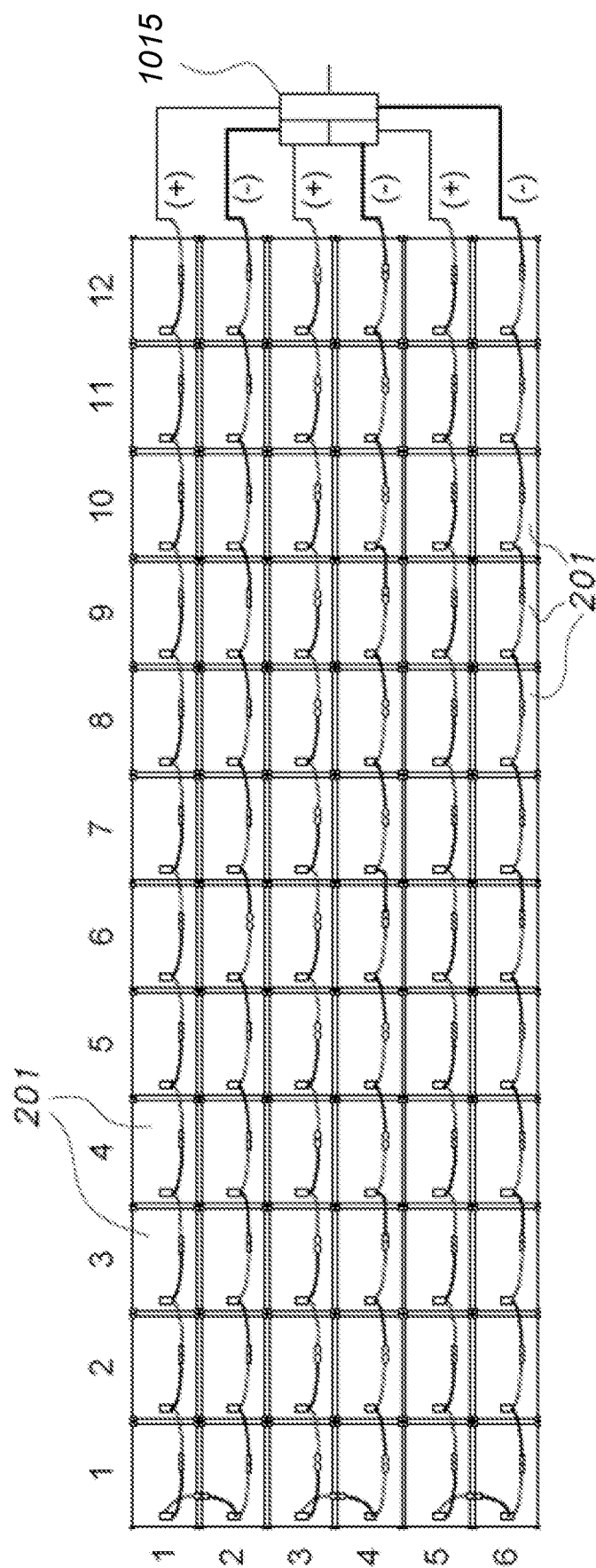
Figure 12B:
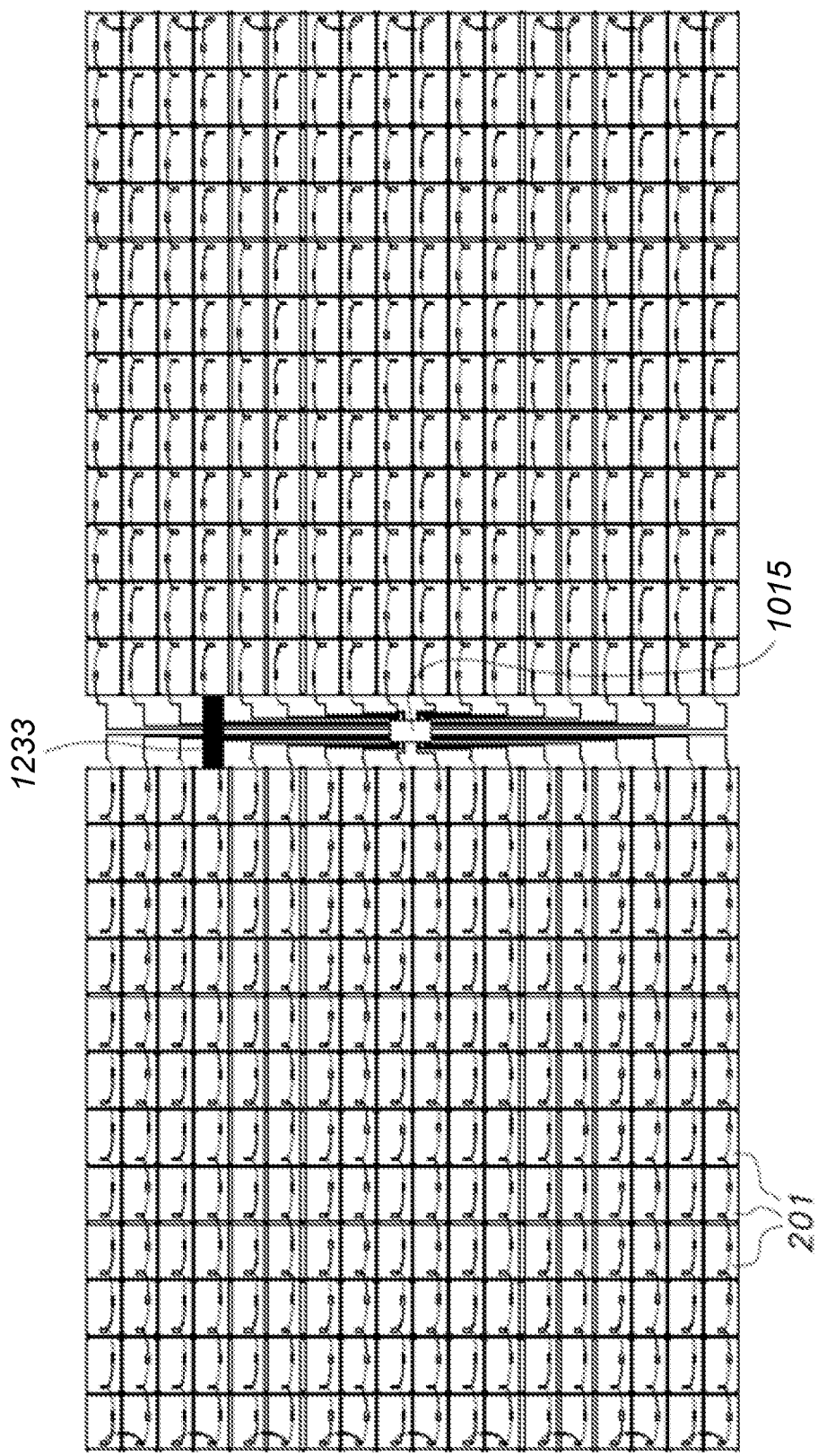
Figure 12C:
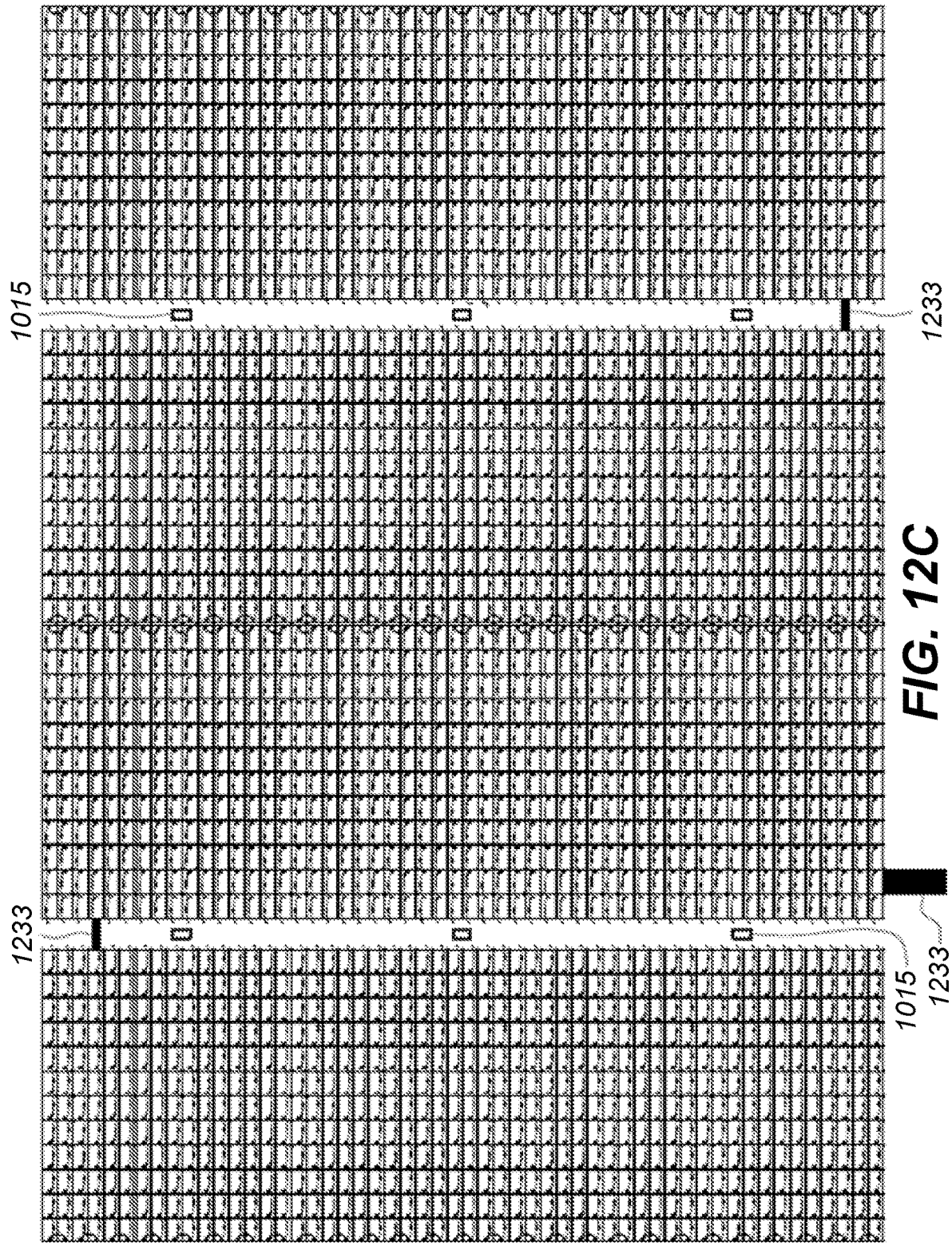
Figure 12D:
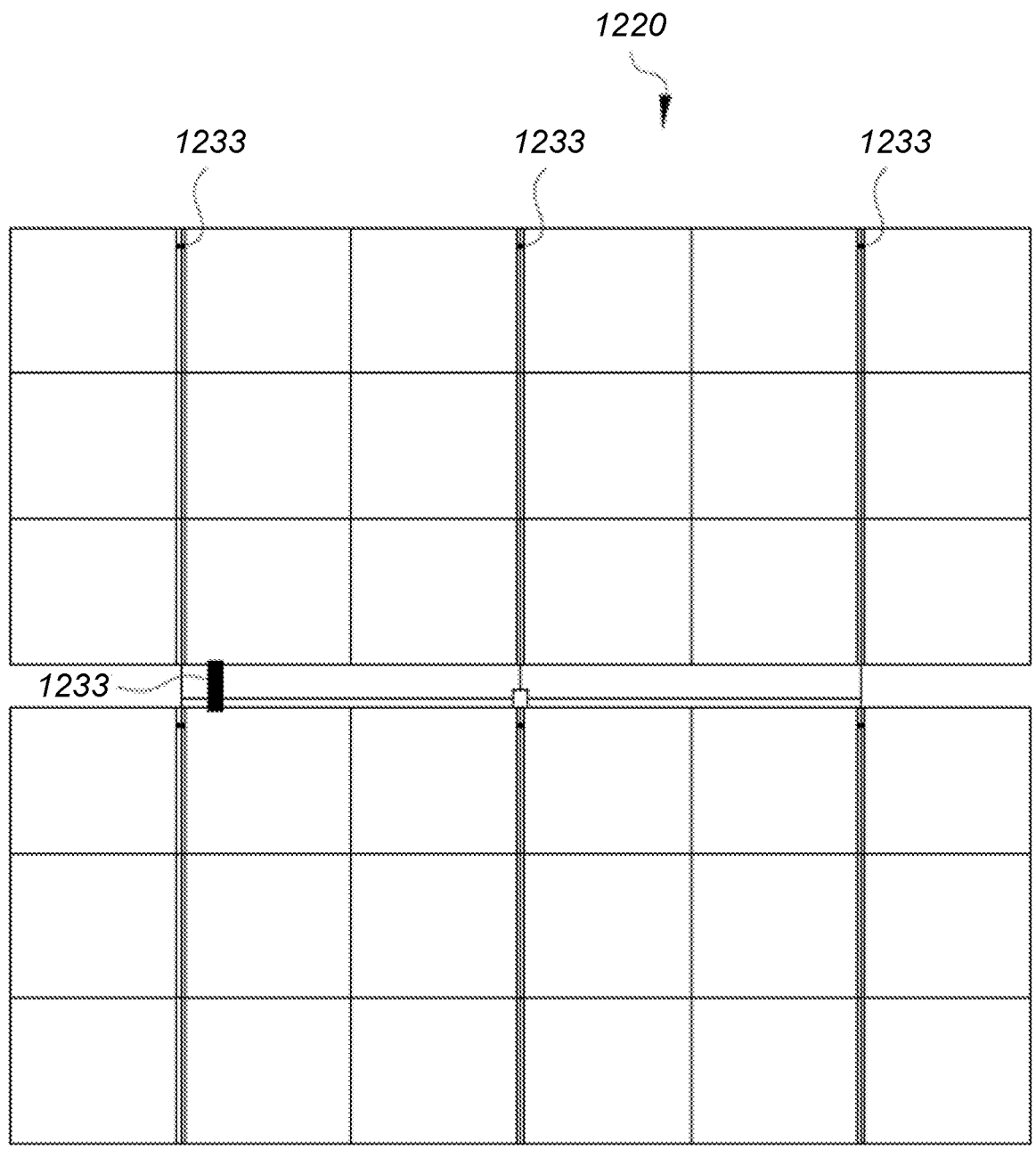

FIGS. 12A 12D are schematic diagrams showing a layout of a solar array for a commercial solar power plant. FIG. 12A shows a partial string array of 3 strings of panels arranged in 6 rows. FIG. 12B expands 12A to show a string array comprising 18 strings with a string inverter depicted in the center. FIG. 12C further expands 12B to show 6 string arrays further co-located to one another. FIG. 12D further expands 12C to show a complete solar array.

DETAILED DESCRIPTION

Overview

The disclosed technology provides a technique for generating electricity using either commercially available, utility scale, solar PV (e.g., CSi, CdTe, CIGS, CIS) modules, or new and novel adaptations of commercially available, utility scale, solar PV modules, or new module technologies, a plurality of which are mounted in such a way as to be both in direct contact with the earth's surface and parallel to the same. This establishes an earth orientation of the solar PV modules, as distinguished from a solar-orientation, although contouring of the soil and other mounting considerations will take into account the angle of the sun.

The modules are placed in a grid pattern both edge to edge and end to end as if tiles on the floor of a house. The "utility scale" nature of the modules limits the application of said system to voltages exceeding 600 volts DC which ensures the system is placed "behind the fence" whereby limiting access to trained professionals. There can be variations in the threshold voltage, as it is possible to design arrays that can safely operate at higher voltages in unprotected environments, a non-limiting example being 800 volt arrays for unprotected areas. The method of attachment of the modules to one another or to the earth is not limited by this application. This arrangement of modules substantially reduces wind loading effects of the modules. The arrangement of the modules electrically is in such a way as to allow for both series and parallel connections, and eliminates, but does not preclude, the need for discrete wiring harnesses and harness supporting means used by traditional utility scale solar plant PV power plant systems. This arrangement of modules provides for significant advantages with the use of commercially available string/micro inverters, but does not preclude the use of industry standard central inverters or alternate power conversion and transmission technologies.

This arrangement of modules in conjunction with the use of active electrical protective devices such as ground fault interruption and arc fault interruption, fully eliminates the need and subsequent use of electrical grounding and bonding of the modules to the structure for purposes of personal protection per code compliance. In contrast, these devices, when used in conjunction with conductive module support structures do not meet the protection levels necessary for code compliance, and thusly require the use of bonding and grounding of the modules.

This arrangement of modules fully eliminates the need and subsequent use of steel and steel structures in the power plant thereby reducing and/or eliminating the natural weathering effects of corrosion while enhancing life expectancy of the power plant from a minimum requirement of 25 years to greater than 40 years. This system does not preclude the use of steel, coated or otherwise for site-specific applications.

The arrangement of modules allows for both commercially available and new techniques for module cleaning and/or dust removal from the modules surface, increasing the effective energy production rate of the modules.

The arrangement of modules and disclosed technology significantly reduce the negative effects of high wind forces on the modules. These wind forces, which in certain geographies reach hurricane force strength, often preclude the construction of solar power plants in those regions, or significantly increase the expense of doing so. In addition, the modules themselves are easily damaged by high winds requiring significant repair and replacement expenditures. By removing the modules from the direct forces of wind, the negative effects of cyclic loading, the "micro-cracking" is effectively eliminated.

The disclosed technology allows for both commercially available and new or novel methods for module cooling from the backside of the modules' surface including evaporative cooling, alternate high emissivity coatings, the addition of "air vents" on the edge of the module frame, the addition of various enhanced heat transfer materials and or methods, thereby increasing the effective energy production rate of the modules. The positioning of the modules on the ground results in avoiding indirect sunlight and heat from ground exposed to sunlight from heating the backsides of the modules. As a result, rather than being a source of additional heat, the ground beneath the modules becomes more of a heat sink. In order to take further advantage of this, the modules are coated on the backside with a dark or heat transmitting coating in order to promote radiant heat transfer to the ground or airspace beneath the modules.

The disclosed technology increases the power density per acre of land. The quantity of acres used per unit of power production is reduced by more than 50% from traditional utility scale solar plant PV power plants.

The disclosed technology allows the PV array to follow the existing contour of the land whereby the need for land preparation such as mass grading, plowing, tilling, cutting, and filling as is typically needed for utility scale solar plant PV Power Plants can be significantly reduced and even eliminated.

The disclosed technology inherently results in an effective decrease in annual module performance yield as measured in kWhrs per kWp as compared to traditional solar PV power plant systems as a result of not being oriented to the sun as are the trackers and racks. While the energy performance is significantly reduced, the reductions in electrical losses due to wiring, energy losses due to module cleaning, costs materials and construction, construction schedule and risk result in an overall reduction in produced energy price (LCOE) of greater than 10% over current technologies.

The disclosed technology provides a system for a solar PV module directly mounted to the earth. In one non-limiting configuration, a bracket assembly utilizes the module frame as the structural support system by securing the four corners of the solar PV module frame directly to the earth leaving no air gap between the earth, frame corners, and bracket assembly. Earth mounting with no air gap reduces wind loading and uplift forces, and eliminates shading from panel to panel, has zero or minimal row spacing requirement, and increases the ground coverage ratio. This earth mounted PV system orients the PV panels parallel to existing topography and the solar panel arrays can be positioned at any azimuth angle.

Solar panels, sometimes called solar modules, are configured as tiles suitable for installation directly on the earth, and are configured to take advantage of the cooling and heat sinking effects of the earth. In placing the panels, attachment brackets may be used. The panels are snapped into or otherwise secured to the attachment brackets, retaining a solar array on the ground or in close proximity to the ground. The ground placement allows a low cost configuration in that it avoids the requirements for mounting the panels on racks, and avoids shadows and the consequential need for spacing between rows.

Since the panels are not mounted on racks, the requirements for wind tolerance are significantly reduced. This also reduces the need to anchor the panels because there are no racks to mount, and since the panels are on the ground, there is substantially less lifting due to wind conditions.

The mounting may use attachment brackets which connect adjacent panels together. While it is possible to anchor the brackets to the ground, the anchoring requirements, meaning anchoring force, is greatly reduced because the panels are not supported above-ground in the wind at an angle to the horizontal. Instead, the panels rest substantially flat on the ground or near the ground.

The brackets secure the panels to each other and maintain a fixed positioning of the panels so as to stabilize the panels in a desired position. Anchor stakes augment this stability, but need only secure the panels against forces experienced when laid flat on the ground, which is substantially lower than the force incurred in rack mounted or tracker mounted configurations.

The lack of shadows is in part the effect of the panels not being tilted. This results in reduced power conversion as compared to panels oriented toward the sun, but if the total costs of the array without racks compares favorably with the loss of output from flat placement, flat placement can be cost-effective.

The lack of shadowing between adjacent rows of panels falls into this economic balance. The reason there is no shadowing is that the shadowing is created by the racking, and more specifically, from the angled positioning of the racked panels. Since racking is not used, there is no shadowing, which allows configurations which close the gaps between sequential rows. Elimination of the gaps establishes a two-dimensional connection array, meaning closely adjacent panels extend in a row-wise direction as well as across sequential rows because sequential rows are also adjacently positioned. In other words, gaps between sequential panels from row-to-row closely approximate gaps between sequential panels along the rows.

This adjacent positioning allows wiring connections or harnesses to take advantage of the adjacent relationships across two or more rows, thereby reducing the need for harness connections. In a particular arrangement, "home run" harness connections, commonly referred to as "whips", are significantly reduced because adjacent rows can be connected without "skip stringing" or "leapfrog wiring". In an alternate arrangement, sequential connections can be made with "next" panels in adjacent rows, thereby reducing the length of connections required for "skip stringing" or "leapfrog wiring".

The elimination of racking affords an additional advantage when it comes to harnessing. Since there are no racks, the need to extend the length of racks is reduced to the need to limit the voltages of the strings, without consideration of the costs of the racks, or in the case of trackers, the cost of tracker drive mechanisms. This, in turn, allows the strings to terminate at both ends of the strings close to the inverters. In this respect, it is advantageous to have multiple strings terminate close together, thus allowing inverters to be positioned close to the end terminations of the strings.

Mounting System

Figure 1:
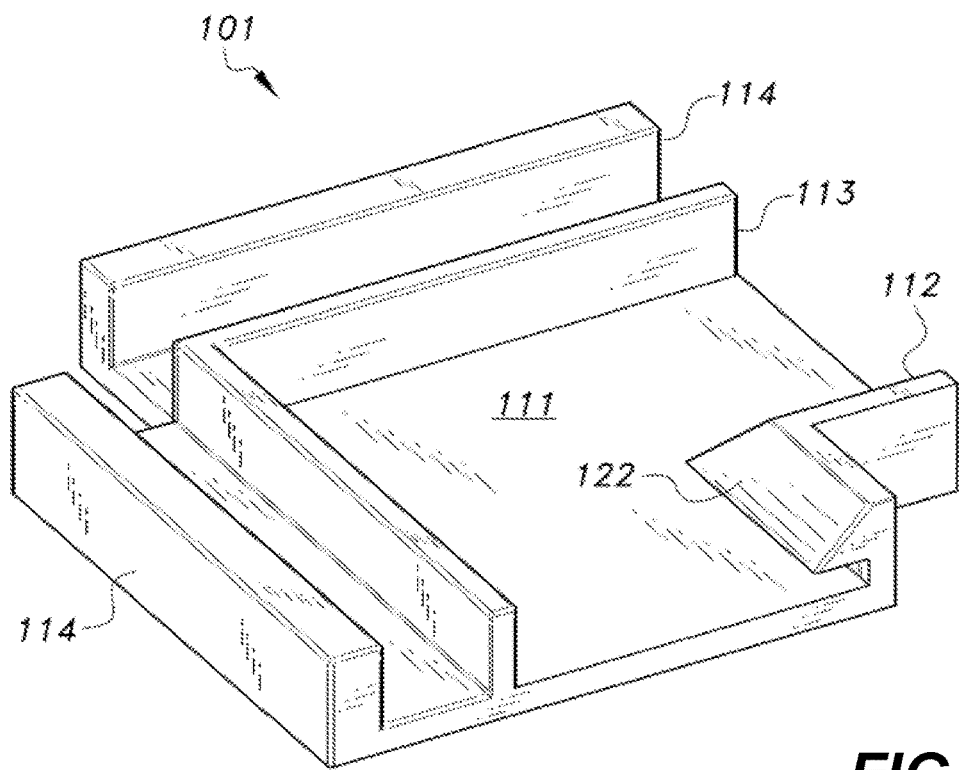
FIG. 1 is a schematic diagram showing a corner bracket used for attachment to a solar panel.

FIG. 1 is a schematic diagram showing a corner bracket 101 used for attachment to a solar panel. Depicted are flat body 111, inner panel attachment flange 112 outer panel attachment flange 113 and linking flange 114. Inner and outer attachment flanges 112, 113 are formed to mate with an outer frame of a solar panel (201, FIG. 2). Outer panel attachment flange 113 is in a middle position because linking flange 114 is intended for attachment outside of outer attachment flange 113.

Also depicted in FIG. 1 is frame grip 122, which is depicted as an angled or wedge portion of inner attachment flange 112. It is noted that the particular configuration of frame grip 122 is dependent on the physical configuration of the solar panel's frame to which corner bracket 101 mates.

Figure 2:
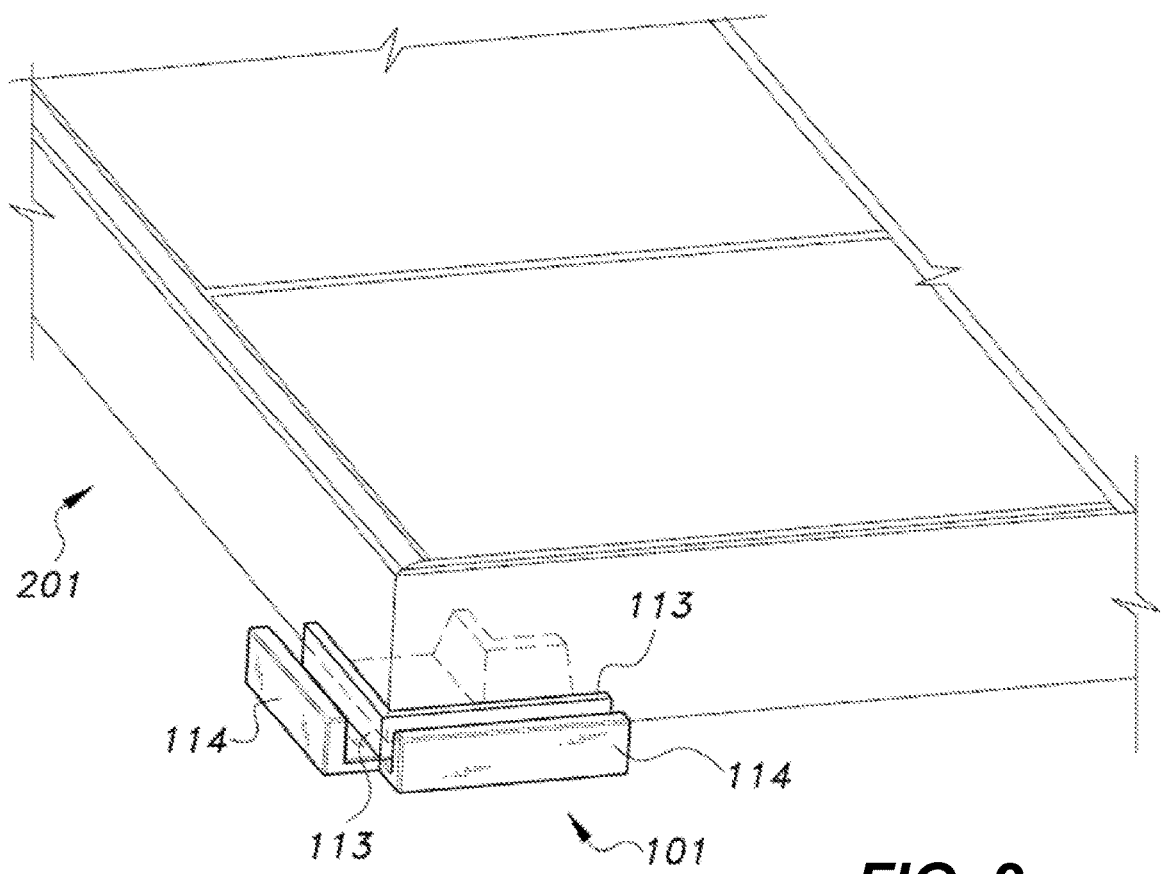
FIG. 2 depicts corner bracket 101 attached to solar panel.
Figure 3A:
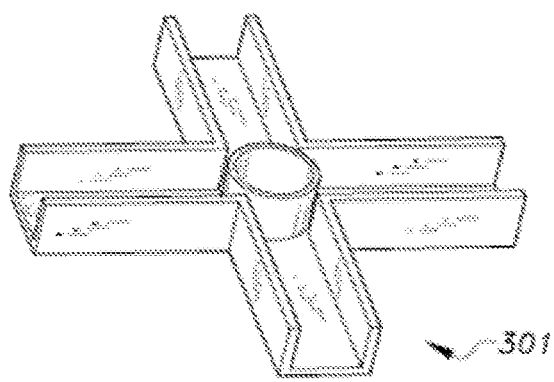
FIGS. 3A-3D are schematic diagrams showing solar panels connected using individual corner brackets and a hold-down clamp.
Figure 3B:
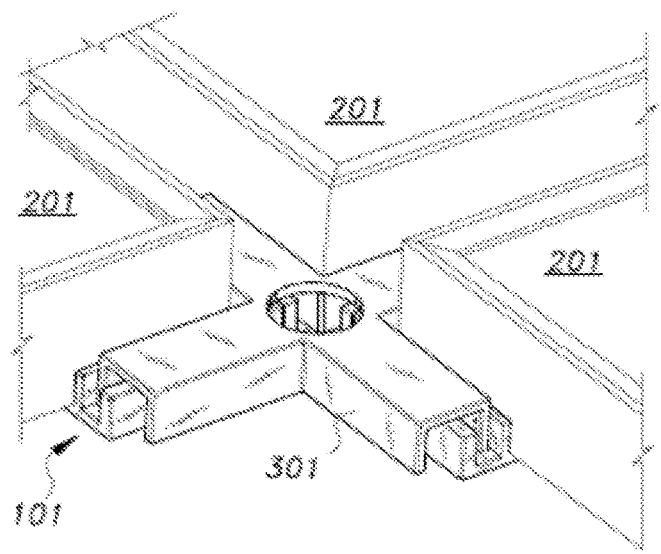
Figure 3C:
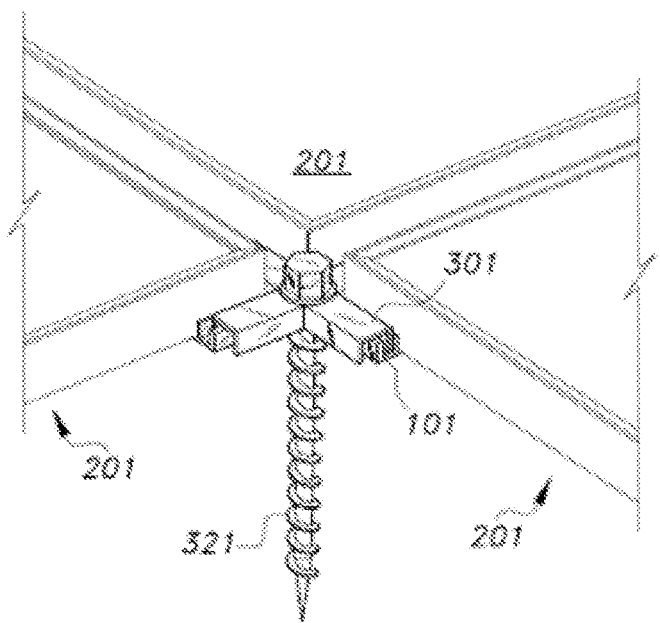
Figure 3D:
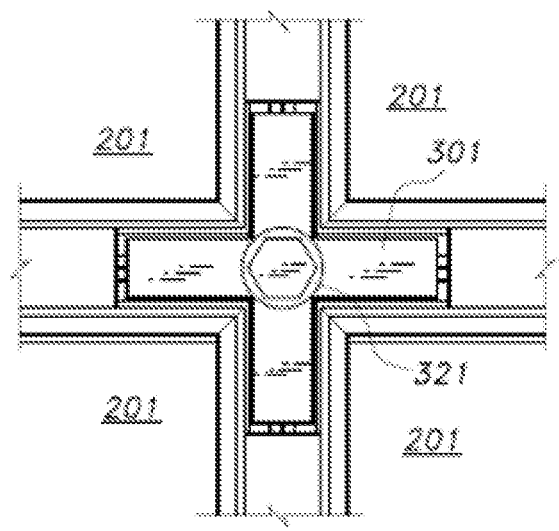

FIG. 2 depicts corner bracket 101 attached to solar panel 201.

FIGS. 3A-3D are schematic diagrams showing solar panels 201 connected using individual corner brackets 101 and a hold-down clamp 301. Hold-down clamp 301 is used to link corner brackets 101, with clamp flanges 314 on clamp 301 engaging linking flanges 114 on brackets 101. Clamp flanges 314 may also closely fit against outer attachment flanges 113 for added stability, according to design choice. Also depicted is anchor bolt or pin 321 (FIG. 3C), which is used to secure hold down clamp 301 to the ground or other supporting surface. Anchor bolt or pin 321 is given as a non-limiting example, as any suitable anchoring mechanism can be used, provided corner brackets 101, hold down claim 301 or another part can be secured to the anchoring mechanism.

Figure 4:
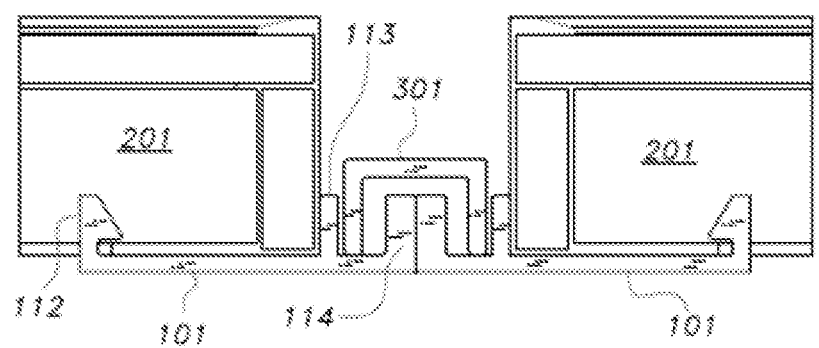
FIG. 4 is a cross-sectional view of the clamping arrangement of FIGS. 1-3.

A cross-section of the arrangement is depicted in FIG. 4. While adjacent corner brackets 101, 101 are depicted as abutting, in the depicted arrangement, corner brackets 101, and hence panels 201 have lateral play, as the primary function of corner brackets 101 and hold down clamp 301 is to retain panels 201 in place on the ground (vertical positioning), with lateral movement inherently limited. So long as the connecting cables or "strings" are able to tolerate the implied variations, the positional tolerance would not affect the assembly. Other physical variations can be employed, so long as the clamping and hold-down functions are accomplished.

Figure 5A:
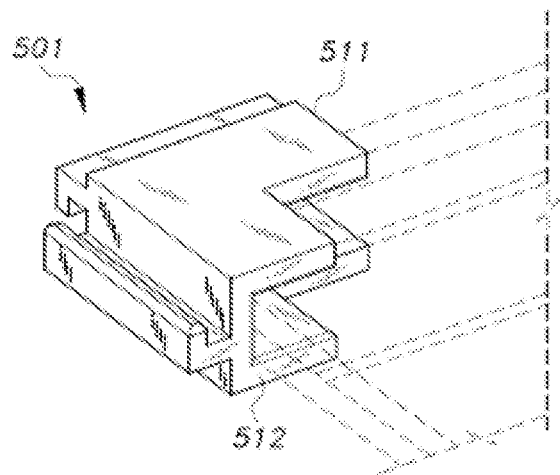
FIGS. 5A and 5B are schematic diagrams showing a configuration of corner brackets, in which horizontal support is used to secure panels.
Figure 5B:
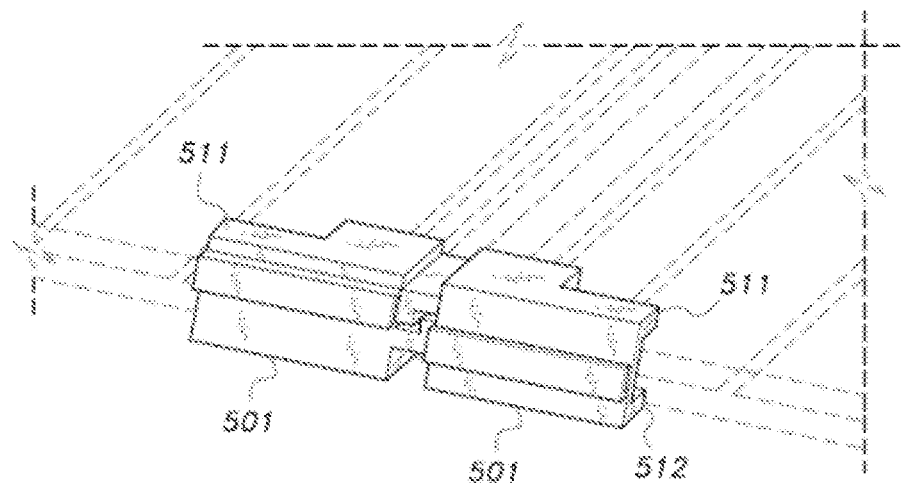

FIGS. 5A and 5B are schematic diagrams showing a configuration of corner brackets, in which horizontal support is used to secure panels. FIG. 5A shows a configuration for a clamp 501 in which top and bottom corner flanges 511, 512 are used. FIG. 5B shows a configuration in which a bracket 531 extends in a straight line connecting two modules 201. By using interlocking links, opposing brackets 501-501 can be locked together, and secured by the weight of the panels 201, with or without the use of anchor bolts or pins 321 (FIG. 3C) or other suitable anchoring device.

In addition to simpler mounting, the flat mounting system makes some maintenance tasks easier. By way of non-limiting example, cleaning equipment can be operated across the tops of the panels, as will be described.

Furrow Mounting

Figure 6A:
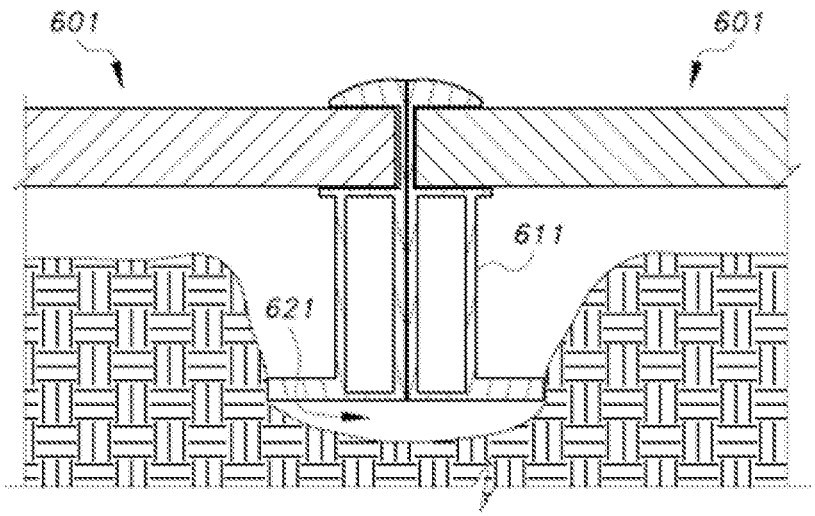
FIGS. 6A and 6B are schematic diagrams showing a solar panel with its edge frame resting on the ground.
Figure 6B:
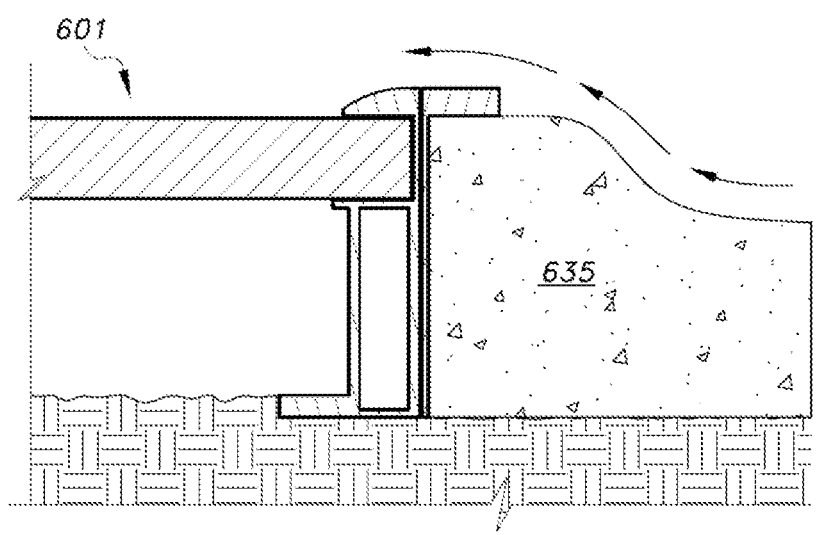

The earth oriented mounting lends to directly placing the panels on the ground without the use of corner brackets or other external bracing. In the case of solar panels with frames, the frame can be rested on the ground, which, in turn, provides mechanical support for the panels. FIGS. 6A and 6B are schematic diagrams showing a solar panel 601 with its edge frame 611 resting on the ground.

Referring to FIG. 6A, the ground is prepared by generally smoothing the ground to desired contours for the panels 601.

Furrows 621 are dug by mechanical means, and the panels 601 are placed on the ground with their edge frames 611 resting against the sides of furrows 621. Furrows 621 serve to positionally stabilize the panels 601, and provide the mechanical support for the panels 601. While it is possible for the panels 601 to directly rest on the ground on parts of the panels 601 other than the edge frames 611, the support by the frames 611 reduces mechanical force applied to the active parts of the panels 601 and leaves additional room for electrical connections. Thus, the furrows 621 are formed as grooves, depressions or channels dug into the ground to receive the edge frames 611.

While smoothing and prior ground preparation is described, it is possible in some circumstances to avoid some of the grading and contouring steps. It is also possible that some ground conditions allow direct placement of the edge frames 611 with the edge frames 611 securing the panels 601 to the ground without a specially prepared furrow. The smoothing facilitates orienting the panels substantially parallel to the ground.

FIG. 6B shows an end stop or curb member 635 positioned at the edge of an array. Curb 635 can be made of any convenient low-cost material and serves to retard movement of the panels along the edges of the array. Since adjacent panels within the array abut one another or are otherwise in close proximity to each other, the only place for lateral movement would be along the edges of the array, which is prevented by curb 635. Curb 635 also directs surface water over the tops of the panels 601, which reduces the potential for washout of the soil and lifting of the panels 601 caused by surface water. Additionally, causing surface water to flow over the tops of panels 601 has some benefit in keeping the panels 601 clean. These advantages are also useful in installations in which corner brackets or other brackets are used to support solar panels.

The depiction of FIG. 6B shows water flow on the upslope side of the array, in which water may have sufficient velocity to flow upward over to top, as indicated by the arrows. Water that pools at curb 635 would be able to flow laterally parallel to curb 635 or percolate into the ground.

Furrows 621 are given by way of non-limiting example. In many installations, it is possible to directly support the panels 601 or the edge frames 611 directly on the ground without digging furrows. In some soil conditions, the edge frames 611 will sink into the soil, whereas in other conditions, the edge frames 611 will remain substantially at the top surface of the ground. It is further expected that the panels 601 will rest against the ground without the use of the edge frames 611, either because the edge frames 611 are allowed to sink below a level at which the panels will rest on the ground, or in cases in which panels are constructed without edge frames.

Alternate Mounting Systems

Figure 7A:
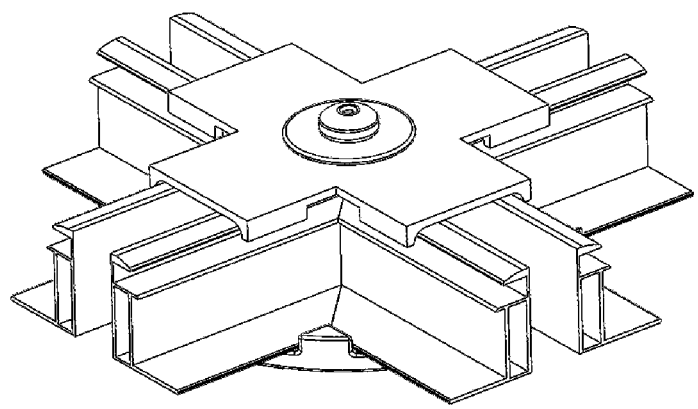
FIGS. 7A-7F are schematic diagrams showing configuration of corner brackets, in which a single disk supports four panels at corners of the panels.
Figure 7B:
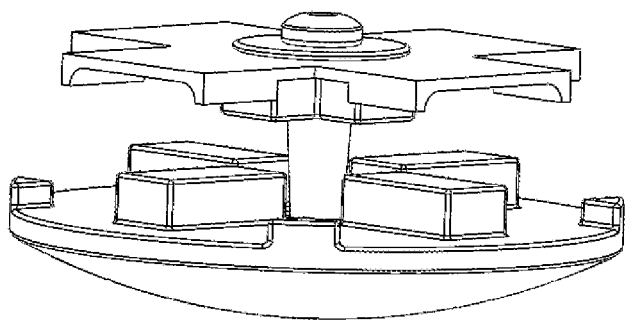
Figure 7C:
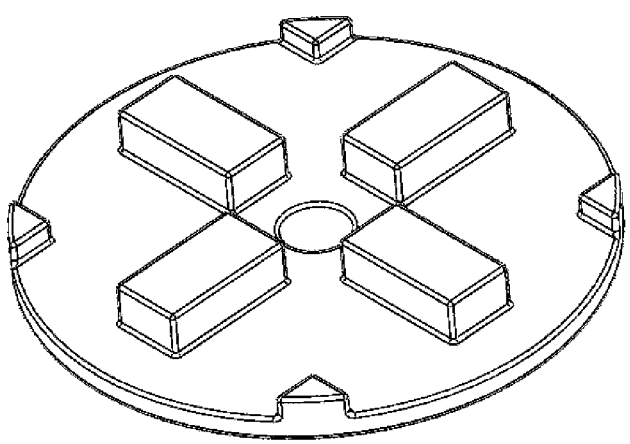
Figure 7D:
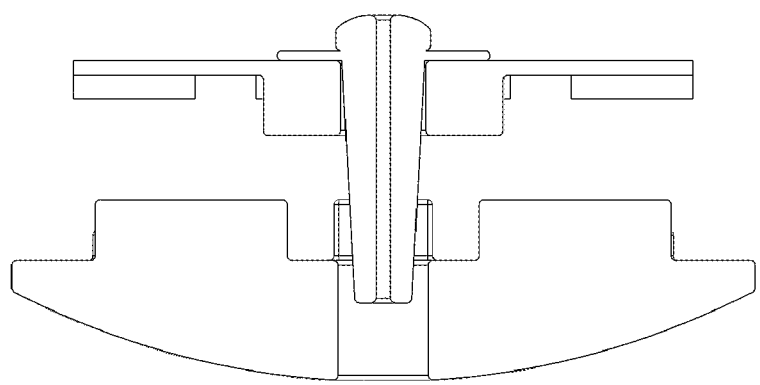
Figure 7E:
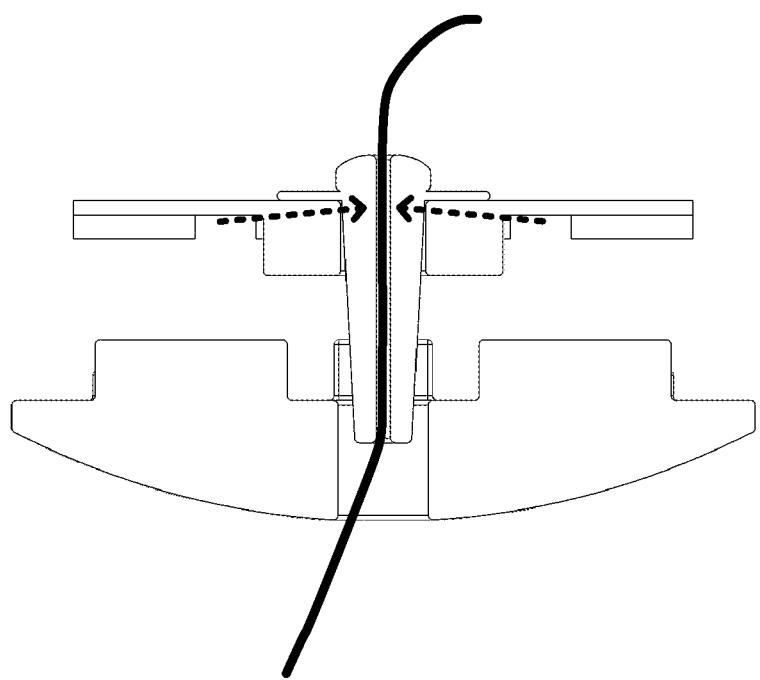
Figure 7F:
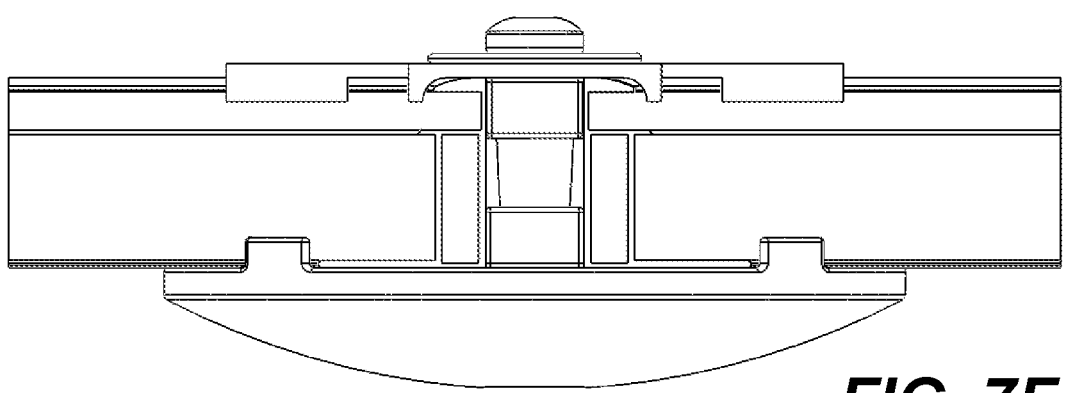

FIGS. 7A-7F are schematic diagrams showing configuration of corner brackets, in which a single disk supports four panels at corners of the panels. FIG. 7A is a perspective view of the corner bracket supporting four panels, with the panels in cut-away view. FIG. 7B shows the arrangement of the corner bracket. FIG. 7C shows a bottom support. FIG. 7D shows a cross-section of the corner bracket with a cinch pin. FIG. 7E shows the corner bracket and cinch pin gripping an anchor cable. FIG. 7F shows the corner bracket with the cinch pin securing panels.

The configuration of FIGS. 7A-7F allows simplified mounting, and further facilitates the use of anchor cables. The anchor cable can be any convenient anchoring system, such as a cable anchoring system produced by American Earth Anchors of Franklin, Mass. (US), one variation being the Model 3 ST60QV anchor system, which uses a pivoting spade attached to wire rope. The wire rope is swaged or cinched by a swage fitting such as an American Earth Anchors Quickvice QV18 swage fitting (Quickvice is a trademark of American Earth Anchors). The anchor system sold by American Earth Anchors is given by way of non-limiting example, as a wide variety of convenient anchoring systems can be used.

Advantageously, since the panels are resting on the ground, they are not generally exposed to sufficient upward force to lift them upward. Therefore, the soil anchoring system need only provide intermittent anchoring support, for example when exposed to weather events resulting in strong winds.

Figure 8A:
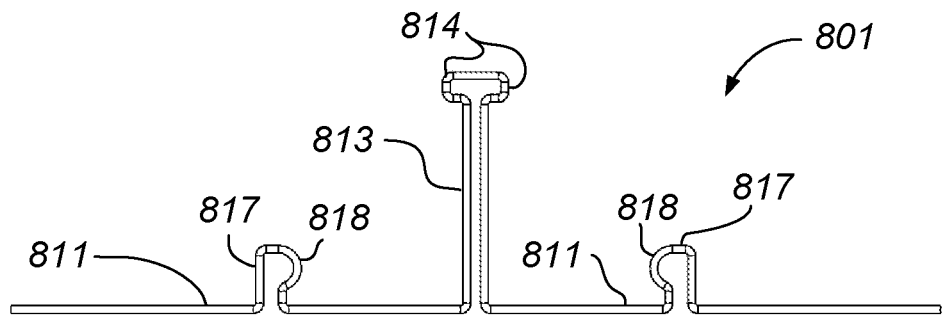
FIGS. 8A-8C are schematic diagrams showing configuration of a spring clip arrangement used to link panels with a minimal gap between panels.
Figure 8B:
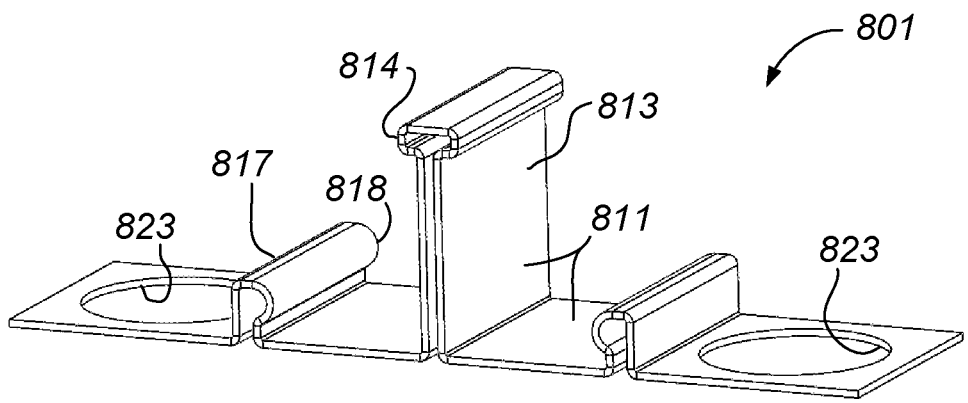
Figure 8C:
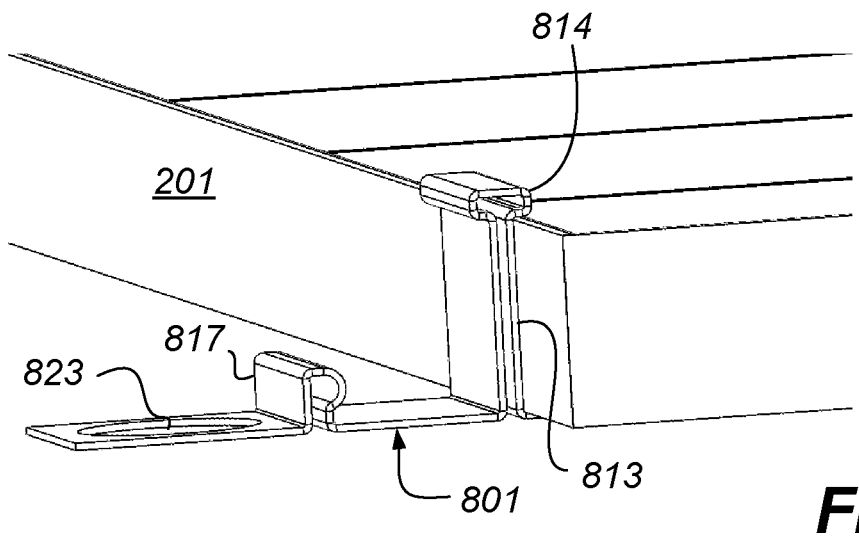

FIGS. 8A-8C are schematic diagrams showing configuration of a spring clip arrangement used to link panels with a minimal gap between panels using spring clip 801. FIG. 8A shows spring clip 801 in profile. FIG. 8B shows spring clip 801 in an elevation view. FIG. 8C shows spring clip 801 engaging one solar panel. Spring clip 801 comprises a flat sheet 811, folded to outer frame support 813 (for the outer frame sides of solar panels), with raised retainer lips 814, and two inner frame supports 817 (for inner frame edges of the solar panels), with raised retainer lips 818. As can be seen in FIG. 8C, solar panel 201 is retained with its outer frame resting against outer frame support 813 and held down by retainer lip 814. The corresponding inner frame support 817 is hidden from view in FIG. 8C. Stake holes 823 (FIGS. 8B and 8C) facilitate anchoring spring clip 810 to the ground, for example by use of an anchor stake or an alternate anchoring system such as the above-mentioned cable anchoring system produced by American Earth Anchors.

Figure 9A:
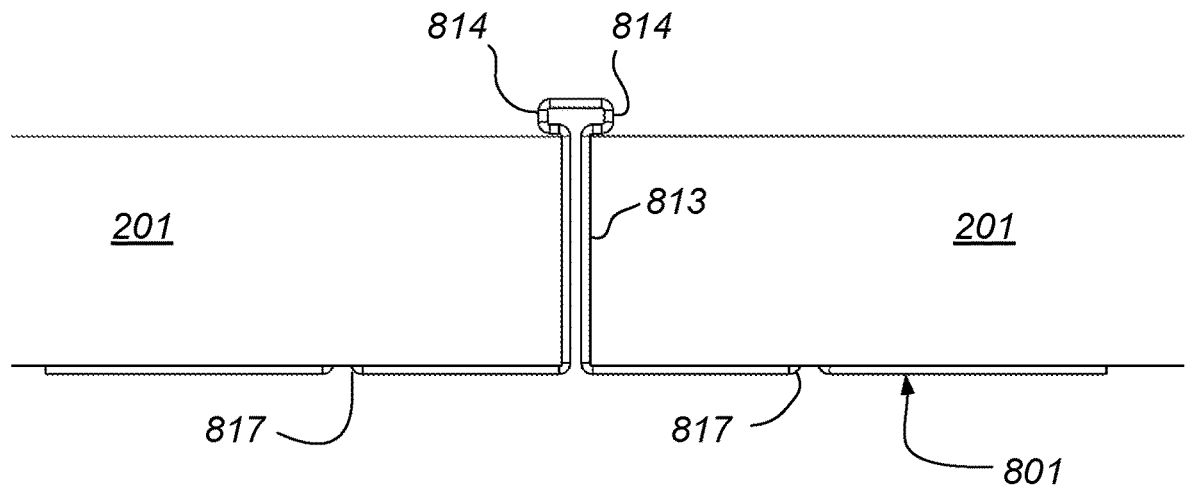
FIGS. 9A and 9B are schematic diagrams showing the spring clip of FIGS. 8A-8C gripping panels.
Figure 9B:
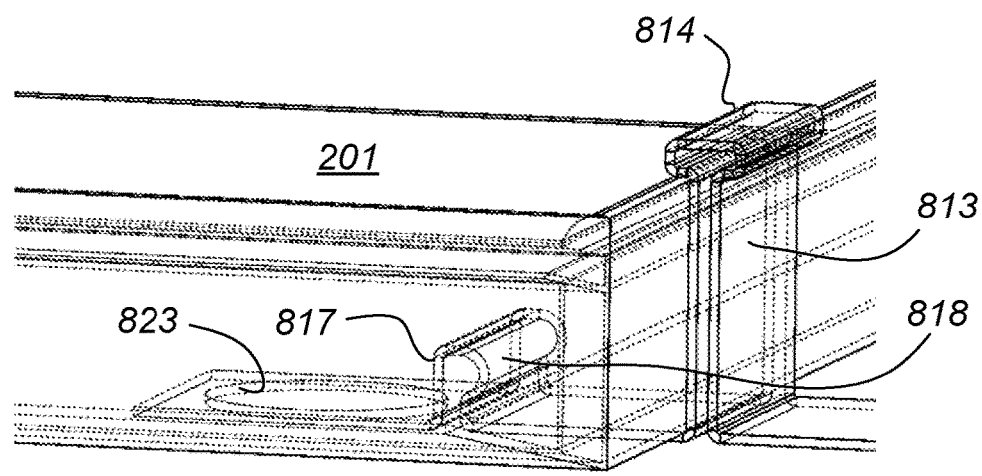

FIGS. 9A and 9B are schematic diagrams showing the spring clip of FIGS. 8A-8C gripping panels. FIG. 9A shows two adjacent panels 201 held by spring clip 801. FIG. 9B shows the gripping arrangement of spring clip 801. As can be seen in FIG. 9A, the arrangement is such that adjacent solar panels 201-201 fit closely together, which reduces the gap between the adjacent solar panels and reduces the tendency of the solar panels 201 to lift when exposed to strong winds.

To install solar panels 201 into spring clip, the panels are positioned in place and downward pressure is applied in order to cause the panels 201 to snap into place.

Backside Cooling

A further advantage of mounting the modules on the ground or just above the ground is that cooling from the backside of the modules' surface is easily accomplished. Cooling techniques can include, by way of non-limiting example, evaporative cooling, alternate high emissivity coatings, the addition of "air vents" on the edge of the module frame, and the addition of various enhanced heat transfer materials and or methods. The increased cooling, by reducing the operating temperature, increases the effective energy production rate of the modules. The positioning of the modules on the ground results in avoiding indirect sunlight and heat from ground exposed to sunlight from heating the backsides of the modules. As a result, rather than being a source of additional heat, the ground beneath the modules becomes more of a heat sink. In order to take further advantage of this, the modules are coated on the backside with a dark or heat transmitting coating in order to promote radiant heat transfer to the ground or airspace beneath the modules. By way of non-limiting example, the dark or heat transmitting coating is provided as blackpigmented Tedlar® PVF, sold by E.I. duPont de Neumours, of Wilmington, Del., or a dark Tedlar® coating sold as "Tedlar® Charcoal".

Ventilation of the backside can be accomplished by a variety of techniques. By way of non-limiting example, outlet vents can connect to one or more vertical stacks to use convection to remove warm air. Alternatively, DC power can be used to operate fans either when power is produced or when peak power is sensed. Inlet vents can use separate supply tubing or louvers cut into edge frames of the modules.

Stringed Panels

Figure 10A:
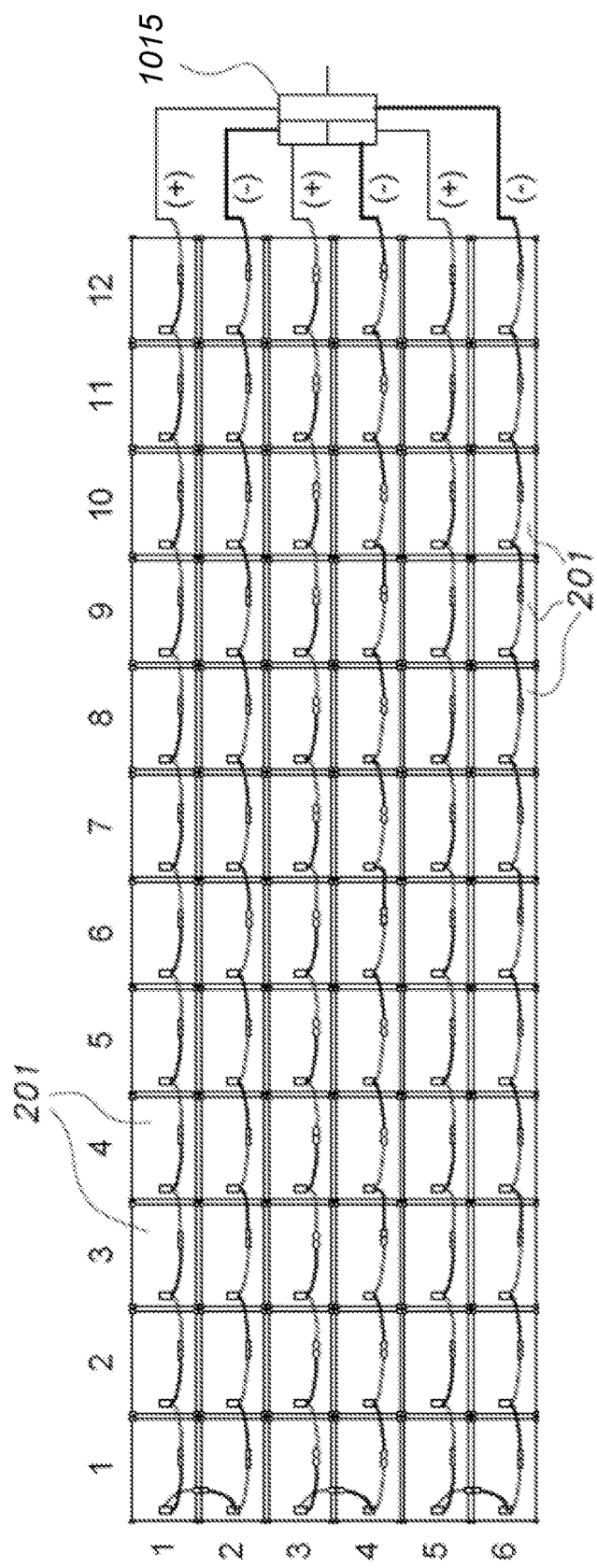
FIGS. 10A and 10B are schematic diagrams showing a wiring connection layout for adjacent solar panels.
Figure 10B:
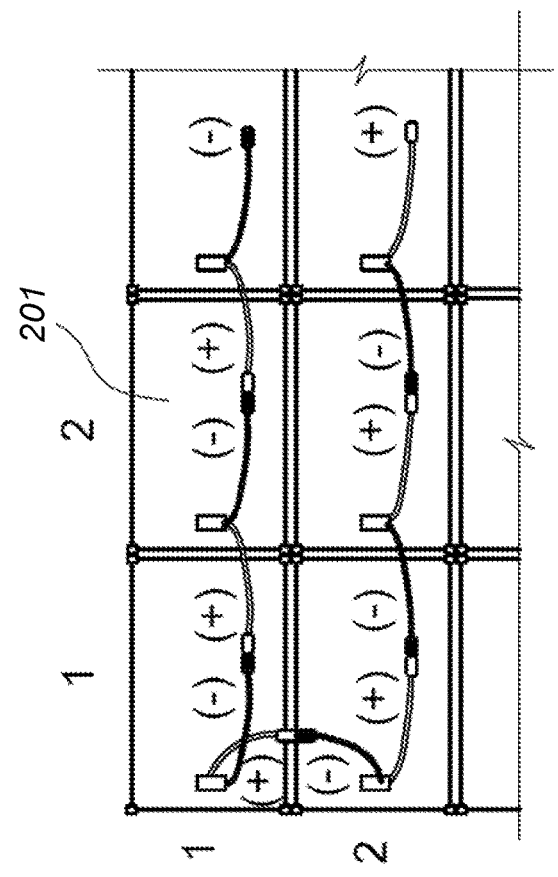

FIGS. 10A and 10B are schematic diagrams showing a wiring connection layout for adjacent solar panels 201. FIG. 10A shows an array of 3 strings of panels arranged of in 6 rows. FIG. 10B shows connection details. Adjacent panels 301 within a row are series connected. At one end of the row, the series connection extends to the next row, and then returns to the starting end. The end connections are in turn connected to inverter 1015. Inverter 1015 converts the power for downstream power use in the usual manner. While one inverter 1015 is shown, multiple inverters 1015 can be used, to place the inverter connection closer to the terminal ends of the rows.

This arrangement limits the length of the series connection, and thereby limits output voltage of the array itself to permissible levels. A typical voltage limit for a string of arrays is 1500 volts, although in residential installations and other installations where non-qualified personnel are present are typically limited to lower voltages, such as 600 volts. The arrangement conveniently limits the voltage to the series output by limiting the length of the respective strings (i.e., the number of panels connected in series).

The stringing technique works because, without racking or trackers, the length of the rows can be made shorter. Additionally, since there is no separate pathway between adjacent rows, running harnessing between rows is less complicated. By way of non-limiting example, the length of the rows can be a number of panels to produce half the maximum design voltage (to accommodate the return run). The individual panels are provided with terminal leads or pigtails, which are directly connected to each other. This arrangement eliminates the need to provide "home run" harness connections to link the end of a string of panels to an inverter connection at the end of the row. The end-of-row connection must still be connected to the nearest inverter if the inverter is not situated immediately at the end of the row, but the intermediate connections required to extend a string to the end of a much longer row are eliminated. Additional reduction in harnessing connections can be achieved by the use of individual inverters at the ends of the respective pairs of rows.

Power Output

Figure 11:
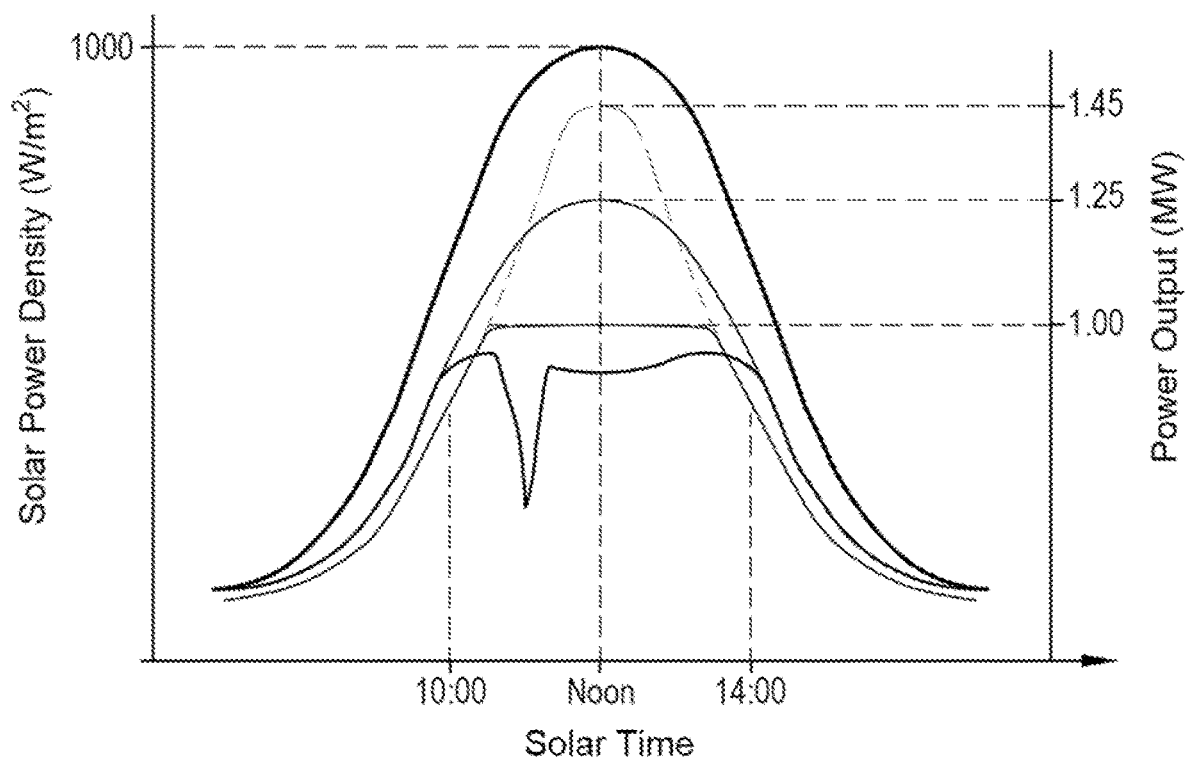
FIG. 11 is a graphic diagram showing a sample output for a single clear sky day of the operation of a solar power plant.

FIG. 11 is a graphic diagram showing a sample output for a single clear sky day of the operation of a solar power plant. The horizontal axis represents time, specifically a sample of daylight hours from roughly 7 AM to roughly 7 PM, where "solar noon" is represented by the peak of the graph. The vertical axis on the left represents the available sunlight, or "solar insolation" as measured in watts per meter squared (W/m2) or the typical amount of energy available from the sun during a given day. The curve which peaks out at 1000 W/m2 is representative of a typical day of sunlight. The peak, as represented by "noon" is solar noon, not to be confused with the 12 o'clock hour, which typically varies from solar noon. The vertical axis on the right indicates the AC power output of the power plant, as well as the DC power potential of the power plant, on common scales of MW, or megawatts. The actual AC power output of the plant is represented by the two lower curves. The curve characterized by the double hump is a typical sample of a tracker type solar plant, with a maximum delivered power of 1 MW (in this example). The sharp dip in the tracker curve is emblematic of a cloud moving across the power plant between the plant and the sun. The other lower curve represents the earth-oriented power plant power curve, also with a maximum delivered power of 1 MW. The two dotted lines extending above the power curves represent the additional unused portion of DC power available. The smaller of the two curves, which peaks out at 1.25 is the tracker power plant, while the taller curve, peaking out at 1.45 is the earth-oriented power plant.

The AC power output of the power plant is intentionally limited for practical reasons, mostly related to grid capacity to absorb large amounts of power during a small part of the day. Therefore the AC power output shows a flat peak at 1.00 MW on this graph. The excess power is either not used, or applied to alternative uses such as energy storage. If alternative energy storage is limited or not available, then it is possible to use the additional energy to support the grid in volt-ampere reactive units (vars, sometime given as VARs), or other power functions other than direct increases in power output (MW). Alternatively, the excess power con be purchased as surplus power by the grid utility or transported across the grid for use at a remote location.

An economic advantage of the earth-oriented arrangement of the solar modules results from the relative economics of the DC power generation components as opposed to the total cost of operations of the power plant. As depicted in FIG. 11, the two power curves have an arbitrary limit of 1 MW. This limit is set by the utility company, to which the power is sold. This limit is a function of the needs of the utility company at the point of interconnection of the power plant and cannot be exceeded by contract nor design. An important point of note is that the available DC power from the earth-oriented power plant is greater than the available DC power from the tracker power plant as is depicted in FIG. 11. This fact is a result of the difference in power plant design, function, and economics. The earth-oriented power plant has more DC power available because it has more modules in use for the same size AC. This is due to the elimination of the additional physical hardware required to hold the modules in space as well as the amount of land required to house the quantity of modules mounted on racks sufficiently spaced apart as to not shade one another. The earth-oriented plant has an intrinsic advantage over the tracker and fixed tilt plant in that it can contain more DC as a percentage of the design output which translates to the AC size. The additional DC power in the power plant has intrinsic value when available. This is true for any solar plant sized with a DC:AC ratio greater than 1.0. Since it cannot be used to deliver real power to the grid (the delivery of which results in revenues for the power plant owner), it is maintained as potential power, waiting to be dispatched when and if needed. There are multiple ways this intrinsic value is captured and is able to bring value to the asset owner.

1) During periods of intermittent cloud cover, the clouds may only cover portions of the power plant. The balance of the plant is available to run full power. The potential power of the additional DC has the effect of allowing the plant to ride through lower light conditions from clouds while still delivering 100% of the AC power plant capacity allowed by the grid connection. If there is greater DC potential, the power plant can ride through larger clouds, and slower moving clouds without going below 100% capacity. This effect is currently not calculated in the industry as it is currently impossible to make these measurements. As such, approximations are used. The accuracy of these approximations can only be determined by empirical means.

What can be said is that the additional DC potential will result in some amount of benefit that is greater than zero.

2) The utility operator receiving real power from the power plant has developed the means to use the potential DC power to the benefit of their system. This benefit comes in the form supplemental voltage, and frequency regulation of the grid by adjusting the power factor control capabilities of the connected set of inverters. Modern solar power operators have become aware of this benefit, and are now selling this portion of the available power in the form of vars to the utility. The additional DC potential of the earth-oriented plant brings additional vars available to be sold as compared to a non-earth-oriented solar plant of the same AC power rating.

3) As the use of solid state batteries or other energy storage or conversion means have become more financially viable, the ability to convert the potential DC power from the solar plant into potential DC energy, stored in the storage means, allows for the direct transfer of the potential DC power into the sale of real energy to the grid at times when the sun is not available or other valuable use of the energy. The additional DC potential of the earth-oriented plant brings additional energy potential available to be sold as compared to a non-earth-oriented solar plant of the same AC power rating.

Solar Plant Layout

FIGS. 12A 12D are schematic diagrams showing a layout of a solar array for a commercial solar power plant. FIG. 12A shows a partial string array of 3 strings of panels arranged in 6 rows. FIG. 12B expands 12A to show a string array comprising 18 strings with a string inverter depicted in the center. The inverter 1015 is connected to the strings for purposes of converting the DC power from the strings to AC power. FIG. 12C further expands 12B to show 6 string arrays further co-located to one another. FIG. 12D further expands 12C to show a complete solar array 1220 comprised of 18 string arrays, 18 string inverters, 324 strings, and a single medium voltage transformer which receives power from the 6 sets of 3 series connected string inverters. A utility scale solar power plant typically comprises 1 or more of these arrays.

Cleaning

The flat orientation of the panels also provides advantages as far as cleaning is concerned. Panels in a flat arrangement can easily be cleaned by an automated warehouse street sweeper. Such cleaning devices, such as the FyBot 'L' (trademark of FyBots of Voisins-le-Bretonneux, France), a commercially available fully autonomous warehouse sweeping robot, similar in operation to home-use robotic vacuum cleaners such as the Roomba (trademark of iRobot Corporation), and the automated cleaning technique was tested with a Roomba 690-type cleaner. While cleaning is more important for earth-oriented solar panels, the ability to use low cost automated cleaning allows frequent cleaning at significantly less cost than would be incurred in if one were to institute a regimen for cleaning rack-mounted arrays. The implementation of a low-cost cleaning regimen on earth-oriented arrays results in soiling loss reductions from typically 6% for fixed tilt and 3.5% for trackers, non-cleaned, down to less than 1% for the cleaned earth-oriented array.

Referring again to FIGS. 12A 12D, in order to traverse gaps between the portions of the arrays, bridges 1233 are provided to connect gaps within the array to allow the automated warehouse street sweeper to automatically traverse the gaps. Similar bridges can be provided between arrays as well, so as to allow the cleaning operation to continue automatically across multiple arrays.

CONCLUSION

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. An earth mount enabled utility scale solar photovoltaic array comprising:
   a plurality of solar panels in direct contact with and supported by the ground so as to establish an azimuth-independent earth orientation of the solar panels and positioned in a closely-adjacent arrangement or an abutting arrangement of plural rows of the solar panels, wherein the array of solar panels achieve contact without an intermediate structure between the panels and the ground for structural support;
   at least a subset of the solar panels each supported on the ground by direct contact with the ground at edge frames thereof,
      wherein the solar panels rest on native topography or a smoothed or substantially flat portion of the ground,
      wherein the edge frames of the solar panel rest on a ground support area capable of supporting the edge frames by receiving edge frames of a plurality of panels,
      and wherein the edge frames resting on the ground support area provide mechanical support for the panel; and
   a retention clip comprising a bracket or spring clip arrangement used to link panels at a predetermined proximity to each other, the retention clip engaging individual solar panels, to form an interconnected array of solar panels with flexible joint connections from panel to panel and row to row, wherein the body of the retention clip engages adjacent solar panels at the edge frames to mechanically and flexibly conjoin the solar panels with both lateral and differential vertical movement inherently limited.

2. The earth mount enabled utility scale solar photovoltaic array of claim 1, further comprising:
   a ventilator venting a space between the panels and the ground.

3. The earth mount enabled utility scale solar photovoltaic array of claim 1, further comprising:
   at least a plurality of the solar panels having a dark or heat transmitting coating facilitating heat transfer and coated on an underside of the respective solar panels; and
   a ventilator venting a space between the panels and the ground.

4. The earth mount enabled utility scale solar photovoltaic array of claim 1, wherein the support for the solar panels on the ground at the edge frames comprises:
   a furrow formed as a groove in the smoothed or substantially flat portion of the ground, depression or channel dug into the ground to receive the edge frames of a plurality of panels, whereby the edge frames resting on the furrow provides the mechanical support for the panel.

5. The earth mount enabled utility scale solar photovoltaic array of claim 4, further comprising:
an end curb member abutting at least one edge of the arrangement of plural rows,
wherein the end curb member provides support for increasing positional stability of the solar panels on the ground.

6. A method for providing a solar power plant comprising at least one array of photovoltaic panels, the method comprising:
supporting a plurality of solar panels on the ground with edge frames of the respective panels directly resting on the ground so as to establish an earth orientation of the solar panels in a solar panel array and to establish an earth orientation of the solar panels by resting the solar panels in plural rows on native topography or a smoothed or substantially flat portion of the ground, resting the edge frames of the respective panels on a ground support area capable of supporting the edge frames by receiving the edge frames of the panels, wherein the edge frames resting on the ground support area provides mechanical support for the panel,
wherein the solar panels rest on native topography or a smoothed or substantially flat portion of the ground,
wherein edge portions the edge frames of the solar panel rest on a ground support area capable of supporting the edge portions frames by receiving edge frames of a plurality of panels, so as to achieve direct contact with the ground, without an intermediate structure between the panels and the earth for structural support,
and wherein the edge portions frames resting on the ground support area provides mechanical support for the panel;
providing a retention clip comprising a bracket or spring clip arrangement used to link panels at a predetermined proximity to each other, the retention clip engaging individual solar panels to form an interconnected array of solar panels with flexible joint connections from panel to panel and row to row, wherein the body of the retention clip engages adjacent solar panels at the edge frames to mechanically and flexibly conjoin the solar panels with both lateral and differential vertical movement inherently limited;
wherein the earth orientation reduces the cost of the photovoltaic array by eliminating costs associated with providing and installing elevated supports for the solar panels,
and wherein the earth orientation of the solar panels provides a flat orientation that permits cleaning with automated horizontal surface cleaning equipment.

7. The method of claim 6, further comprising:
using a ventilator to vent a space between the panels and the ground.

8. The method of claim 6, further comprising:
providing at least a plurality of the solar panels with a dark or heat transmitting coating facilitating heat transfer and coated on an underside of the respective solar panels; and
providing ventilation for venting a space between the panels and the ground.

9. The method of claim 6, wherein the support for the solar panels on the ground at edge portions thereof comprises:
a furrow formed as a groove in the smoothed or substantially flat portion of the ground, depression or channel dug into the ground to receive edge frames of a plurality of panels, whereby the edge portions resting on the furrow provides the mechanical support for the panel.

10. The method of claim 9, further comprising:
an end curb member abutting at least one edge of the arrangement of plural rows,
wherein the end curb member provides support for increasing positional stability of the solar panels on the ground.

11. An earth mount enabled utility scale solar photovoltaic array comprising:
a plurality of utility scale solar panels operating in a protected area above 600 Vdc;
means to support the solar panels directly on the ground at edge frames thereof so as to establish an azimuth-independent earth orientation of the solar panels and positioned in a closely-adjacent arrangement or an abutting arrangement of plural rows of the solar panels, wherein the array of solar panels achieve contact without an intermediate structure between the panels and the ground for structural support,
wherein the solar panels rest on native topography or a smoothed or substantially flat portion of the ground,
wherein at least a subset of the edge frames of the solar panel rest on a ground support area capable of supporting the edge frames by receiving edge frames of a plurality of panels,
and wherein the edge frames resting on the ground support area provide mechanical support for the panel;
retention means for linking panels at a predetermined proximity to each other by engaging individual solar panels to form an interconnected array of solar panels with flexible joint connections from panel to panel and row to row, wherein a body of the retention means engages adjacent solar panels with lateral and differential vertical movement inherently limited; and
means to interconnect the solar panels in at least one series-connected string, wherein said at least one series-connected string extends along adjacent or closely adjacent solar panels along at least two rows so that the string has a distance between terminal ends of the series connection less than a lengthwise dimension of the solar panels constituting the string, the means to interconnect comprising wiring connections engaging terminal connections on the plurality of photovoltaic panels in the series-connected string, the wiring connections arranged to connect adjacent panels in an arrangement utilizing at least two rows of panels in the series-connected string connection, in which the string uses said at least two rows to route the connections so that a string starting with a first end termination extends along a direction of said at least two rows and returns along an opposite direction of said at least two rows, thereby reducing or eliminating "home run" connections at the end of the string.

12. The earth mount enabled utility scale solar photovoltaic array of claim 11, further comprising:
an end curb member abutting at least one edge of the arrangement of plural rows.

13. The earth mount enabled utility scale solar photovoltaic array of claim 12, further comprising:
a ventilator venting a space between the panels and the ground.

14. The earth mount enabled utility scale solar photovoltaic array of claim 12, further comprising:
   at least a plurality of the solar panels having a dark or heat transmitting coating facilitating heat transfer and coated on an underside of the respective solar panels; and
   a ventilator venting a space between the panels and the ground.

15. The earth mount enabled utility scale solar photovoltaic array of claim 11, further comprising:
   a ventilator venting a space between the panels and the ground.

16. The earth mount enabled utility scale solar photovoltaic array of claim 11, further comprising:
   at least a plurality of the solar panels having a dark or heat transmitting coating facilitating heat transfer and coated on an underside of the respective solar panels; and
   a ventilator venting a space between the panels and the ground.

17. The earth mount enabled utility scale solar photovoltaic array of claim 1, further comprising:
   the plurality of solar panels comprising a utility scale solar array, operating in a protected area at above 600 Vdc; and
   the earth orientation of the solar panels and support for the solar panels on the ground at edge portions thereof result in the solar panels resting on the smoothed or substantially flat portion of the ground so as to follow the existing contour of the land.

18. The earth mount enabled utility scale solar photovoltaic array of claim 11, further comprising:
   the earth orientation of the solar panels and support for the solar panels on the ground at edge portions thereof result in the solar panels resting on the smoothed or substantially flat portion of the ground so as to follow the existing contour of the land.

19. The earth mount enabled utility scale solar photovoltaic array of claim 1, further comprising:
   the retention clip comprising one or more spring clips engaging individual solar panels, and comprising with raised retainer lips and frame supports engaging the solar panels at edge portions thereof by snapping the panels into the spring clips.

20. The earth mount enabled utility scale solar photovoltaic array of claim 1, further comprising:
   an end curb member abutting at least one edge of the arrangement of plural rows.

21. The earth mount enabled utility scale solar photovoltaic array of claim 1, further comprising:
   an electrical interconnection for the solar panels in at least one series-connected string, wherein said at least one series-connected string extends along adjacent or closely adjacent solar panels along at least two rows so that the string has a distance between terminal ends of the series connection less than a lengthwise dimension of the solar panels constituting the string; the interconnection comprising wiring connections engaging terminal connections on the plurality of photovoltaic panels in the series-connected string, the wiring connections arranged to connect adjacent panels in an arrangement utilizing at least two rows of panels in the series-connected string connection, in which the string uses said at least two rows to route the connections so that a string starting with a first end termination extends along a direction of said at least two rows and returns along an opposite direction of said at least two rows, thereby reducing or eliminating "home run" connections at the end of the string,
   wherein the earth orientation reduces the cost of the photovoltaic array by eliminating costs associated with providing and installing elevated supports for the solar panels,
   and wherein the earth orientation of the solar panels provides a flat orientation that permits cleaning with automated horizontal surface cleaning equipment.

22. The method of claim 6, further comprising:
providing an end curb member abutting at least one edge of the arrangement of plural rows.

23. The method of claim 6, further comprising:
interconnecting the solar panels in at least one series-connected string, wherein said at least one series-connected string extends along adjacent or closely adjacent solar panels along at least two rows so that the string has a distance between terminal ends of the series connection less than a lengthwise dimension of the solar panels constituting the string, the interconnecting comprising wiring connections engaging terminal connections on the plurality of photovoltaic panels in the series-connected string, the wiring connections arranged to connect adjacent panels in an arrangement utilizing at least two rows of panels in the series-connected string connection, in which the string uses said at least two rows to route the connections so that a string starting with a first end termination extends along a direction of said at least two rows and returns along an opposite direction of said at least two rows, thereby reducing or eliminating "home run" connections at the end of the string,
   wherein the earth orientation reduces the cost of the photovoltaic array by eliminating costs associated with providing and installing elevated supports for the solar panels,
   and wherein the earth orientation of the solar panels provides a flat orientation that permits cleaning with automated horizontal surface cleaning equipment.

* * * * *